United States Patent
Sakamoto et al.

(10) Patent No.: US 7,079,561 B2
(45) Date of Patent: Jul. 18, 2006

(54) SURFACE EMITTING SEMICONDUCTOR LASER

(75) Inventors: Akira Sakamoto, Kanagawa (JP); Hideo Nakayama, Kanagawa (JP); Yasuaki Miyamoto, Kanagawa (JP); Jun Sakurai, Kanagawa (JP)

(73) Assignee: Fuji Xerox Co., Ltd, Tokyo (JP)

( * ) Notice: Subject to any disclaimer, the term of this patent is extended or adjusted under 35 U.S.C. 154(b) by 0 days.

(21) Appl. No.: 11/105,450

(22) Filed: Apr. 14, 2005

(65) Prior Publication Data

US 2005/0180476 A1   Aug. 18, 2005

Related U.S. Application Data

(62) Division of application No. 10/384,607, filed on Mar. 11, 2003.

(30) Foreign Application Priority Data

Sep. 2, 2002   (JP)   ............................. 2002-256525

(51) Int. Cl.
*H01S 5/00*   (2006.01)
(52) U.S. Cl. ................. 372/46.013; 372/50.1
(58) Field of Classification Search ............ 372/46.013
See application file for complete search history.

(56) References Cited

U.S. PATENT DOCUMENTS

| | | | |
|---|---|---|---|
| 5,886,370 A * | 3/1999 | Sun et al. ..................... 257/94 |
| 5,978,408 A * | 11/1999 | Thornton ..................... 372/96 |
| 6,075,804 A * | 6/2000 | Deppe et al. ................. 372/96 |
| 6,459,713 B1 * | 10/2002 | Jewell ..................... 372/46.013 |
| 2003/0139060 A1 * | 7/2003 | Sai ............................. 438/767 |

FOREIGN PATENT DOCUMENTS

JP   A 2001-93897   4/2001

* cited by examiner

*Primary Examiner*—James Menefee
(74) *Attorney, Agent, or Firm*—Oliff & Berridge, PLC

(57) ABSTRACT

A method of fabricating a surface emitting semiconductor laser includes a first step of forming, on a substrate, multiple monitor-use semiconductor layers having stripes radiating from a center of the substrate, and a laser portion that includes semiconductor layers and is located on the periphery of the multiple monitor-use semiconductor layers, a second step of monitoring oxidized conditions on the multiple monitor-use semiconductor layers when a selectively oxidized region is formed in the laser portion, and a third step of controlling oxidization of the selectively oxidized region on the basis of the oxidized conditions thus monitored.

3 Claims, 13 Drawing Sheets

SURFACE EMITTING SEMICONDUCTOR LASER

This is a Division of application Ser. No. 10/384,607 filed Mar. 11, 2003. The entire disclosure of the prior application is hereby incorporated by reference herein in its entirety.

BACKGROUND OF THE INVENTION

1. Field of the Invention

The present invention relates to a surface emitting semiconductor laser used as a source for optical information processing, optical communications, optical recording and image forming. The present invention also relates to a method and apparatus for fabricating such a surface emitting semiconductor laser. More particularly, the present invention relates to a technique of accurately defining an aperture surrounded by a selectively oxidized portion of a current confinement region.

2. Description of the Related Art

Recently, there has been an increased demand for a surface emitting semiconductor laser capable of easily realizing an array of sources in the technical fields of optical communications and optical interconnections. Such a laser is also called vertical-cavity surface-emitting laser diode (VCSEL).

The surface emitting semiconductor laser is categorized into a proton injection type with a gain waveguide structure, and a selective oxidation type with a refractive ratio waveguide structure. Nowadays, the latter is getting the mainstream. Generally, the selective oxidation type semiconductor laser has a laser portion of a mesa structure (laser-use mesa). A current narrowing or confining region formed by a selectively oxidizing part of an AlAs layer or AlGaAs layer is formed in the vicinity of the active region of the mesa. The current confinement layer has an increased resistivity and a reduced refractive index. This results in an optical waveguide path.

The degree of dimensional accuracy of the non-oxidized region surrounded by an aperture formed in the current confinement layer and defined by the selectively oxidized region is a very important factor that determines the device performance. The threshold current of laser and the transverse oscillation mode greatly depend on the diameter of the aperture.

A proposal to solve the above problems is described in Japanese Unexamined Patent Publication No. 2001-93897. The proposal forms a linear stripe pattern that is formed on a substrate and has the same composition as that of a pattern of the laser portion having a mesa shape formed on the same substrate. The linear stripe pattern is used as a sample for monitoring. In an oxidization step, the degree of advance of the oxidization reaction on the monitor sample is monitored, and oxidization of the laser portion is controlled based on the monitored degree of advance. The proposal utilizes a phenomenon such that the reflectance of an AlAs layer in the monitor sample becomes higher as oxidization thereof advances. Light is projected onto the stripe-like monitor sample, and the reflectance thereof is monitored.

FIG. 13 is a graph of a relation between light projected onto the stripe-like monitor sample and its reflectance, and FIG. 14 is a graph of a method for controlling oxidization using the conventional monitor sample. Light of a selected wavelength is extracted from the light projected onto the monitor sample, and reflected light is monitored. As shown in FIG. 14, an AlAs layer of the monitor sample has reflectance values r1 and r2 when oxidization thereof starts (time t1) and ends (time t2), respectively. Oxidization of the current confinement layer is controlled by detecting the reflectance obtained at times t1 and t2 or its variation.

However, the proposal described in the above-mentioned publication has the following problems to be solved. The monitor-use sample has a width narrower than the diameter of the mesa of the laser portion (the outside diameter for a cylindrically-shaped mesa) and a stripe-like pattern formed on the substrate on which stripe lines are arranged with a constant period. The monitor sample is defined by anisotropic etching so that it can be simultaneously formed with the mesa of the laser portion. However, the monitor samples of laser devices have considerable dispersion of the line width due to the actual etching conditions. Sometimes, the sidewall (stripe edge) of the monitor sample is not vertical but inclined. When these faulty monitoring samples are subject to oxidization, optical diffraction may take place and prevent accurate measurement of variation from the reflectance r1.

FIG. 15 shows a graph of a relation between reflectance vs. oxidization time for the monitor sample. It is difficult to accurately identify the oxidization initiating time (circle of broken line in FIG. 15) from variation in the reflectance. Further, there is a dispersion of the stripe line width. Thus, the average reflectance r1 obtained from the stripe pattern fluctuates. This makes it difficult to accurately measure the reflectance r1 and detect the oxidization initiating time t1.

If tracking of the oxidized condition on the monitor sample includes error, it will be difficult to reproduce the aperture in the current confinement region as designed at the time of stopping the oxidization reaction. This degrades the production yield and prevents cost reduction. There is another disadvantage. After the step of oxidizing the current oxidization layer, an insulation film and a metal electrode are photolithographically formed. In these processes, the resist films may not be deposited on the substrate evenly. Resist is dropped on the substrate that is being rotated, the stripe pattern restricts movement of the resist and prevents the resist from smoothly moving towards the ends from the center of the substrate. This may prevent evenness in the film thickness of resist. The unevenness degrades the accuracy of an outgoing aperture formed in the metal electrode and affects alignment of the outgoing window with the aperture in the current confinement layer and the optical axis of the laser portion.

SUMMARY OF THE INVENTION

The present invention has been made in view of the above circumstances and provides a surface emitting semiconductor laser and a method of fabricating the same.

According to an aspect of the present invention, a method of fabricating a surface emitting semiconductor laser has the steps of: forming a laser portion of semiconductor layers and at least two kinds of monitor-use semiconductor layers on a substrate, the laser portion including a first reflection mirror layer of a first conduction type, an active region, a III–V semiconductor layer containing Al and a second reflection mirror of a second conduction type, the at least two kinds of monitor-use semiconductor layers having oxidizable regions having different shapes; etching the laser portion so as to form a mesa on the substrate in which a side surface of the III–V semiconductor layer contained in the laser portion is exposed; starting oxidization of the III–V semiconductor layer from the side surface; monitoring a reflectance of each of the oxidizable regions of the at least two kinds of monitor-use semiconductor layers or its variation and obtaining, from results of monitoring, an oxidization terminating time at which oxidization of the III–V semiconductor layer in the laser portion should be terminated; and terminating oxidization of the III–V semiconductor layer at the oxidization terminating time to thus define an aperture that is a non-oxidized region of the III–V semiconductor layer.

According to another aspect of the present invention, a method of fabricating a surface emitting semiconductor laser includes the steps of: forming a laminate of semiconductor layers including a III–V semiconductor layer containing Al on a substrate; forming, from the laminate, first, second and third mesas of different sizes on the substrate so that side surfaces of III–V semiconductor layers included in the first through third mesas are exposed; oxidizing the III–V semiconductor layers of the first through third mesas from the side surfaces thereof; optically monitoring oxidized conditions on the III–V semiconductor layers of the second and third mesas and obtaining, from times when the III–V semiconductor layers of the second and third mesas are terminated as well as the sizes thereof, an oxidization terminating time when oxidization of the III–V semiconductor layer of the first mesa should be terminated; and terminating oxidization of the III–V semiconductor layer of the first mesa to thus form a current confinement layer including an aperture that is a non-oxidized region of the III–V semiconductor layer of the first mesa.

According to yet another aspect of the present invention, a method of fabricating a surface emitting semiconductor laser includes the steps of: forming, on a substrate, multiple monitor-use semiconductor layers having stripes radiating from a center of the substrate, and a laser portion that includes semiconductor layers and is located on the periphery of the multiple monitor-use semiconductor layers; monitoring oxidized conditions on the multiple monitor-use semiconductor layers when a selectively oxidized region is formed in the laser portion; and controlling oxidization of the selectively oxidized region on the basis of the oxidized conditions thus monitored.

According to a further aspect of the present invention, a method of fabricating a surface emitting semiconductor laser includes the steps of: forming, on a substrate, multiple monitor-use semiconductor layers having stripes radiating towards ends of the substrate, and a laser portion that includes semiconductor layers and is located adjacent to the multiple monitor-use semiconductor layers; monitoring oxidized conditions on the multiple monitor-use semiconductor layers when a selectively oxidized region is formed in the laser portion; and controlling oxidization of the selectively oxidized region on the basis of the oxidized conditions thus monitored.

According to a still further aspect of the present invention, a surface emitting semiconductor laser includes: a substrate; and a laminate of semiconductor layers on the substrate, the semiconductor layers including a first reflection mirror of a first conduction type, an active region on the first reflector mirror, a current confinement region including an oxidized region, and a second reflection mirror of a second conduction type, a mesa ranging at least from the second reflection mirror to the current confinement layer, the mesa extending at least from the second reflection mirror to the current confinement layer, the oxidized region of the current confinement layer utilizing an oxidization terminating time obtained by detecting times when oxidizable regions included in at least two kinds of monitor-use semiconductor layers having different shapes are totally oxidized.

According to another aspect of the present invention, an apparatus for fabricating a surface emitting semiconductor laser includes: a projection part projecting light onto an area including at least two kinds of monitor-use mesas respectively including III–V semiconductor layers that contain Al and have side surfaces exposed, when the side surfaces and a side surface of a III–V semiconductor layer of a laser-use mesa that contains Al and a side surface exposed are oxidized; a photoelectric conversion part converting reflected lights from the monitor-use mesas into electrical signals; an oxidization terminating time estimation part that detects times when the III–V semiconductor layers of the two kinds of monitor-use mesas are totally oxidized on the basis of the electrical signals, and estimates an oxidization terminating time when oxidization of the III–V semiconductor layer of the laser-use mesa should be terminated; and an oxidization control part causing oxidization of the III–V semiconductor layer of the laser-use mesa to be terminated at the oxidization terminating time to thus define a current confinement layer in the laser-use mesa.

BRIEF DESCRIPTION OF THE DRAWINGS

Preferred embodiments of the present invention will be described in detail based on the following figures, wherein.

DESCRIPTION OF THE PREFERRED EMBODIMENTS

A description will now be given of embodiments of the present invention with reference to the accompanying drawings.

Figure 1A:
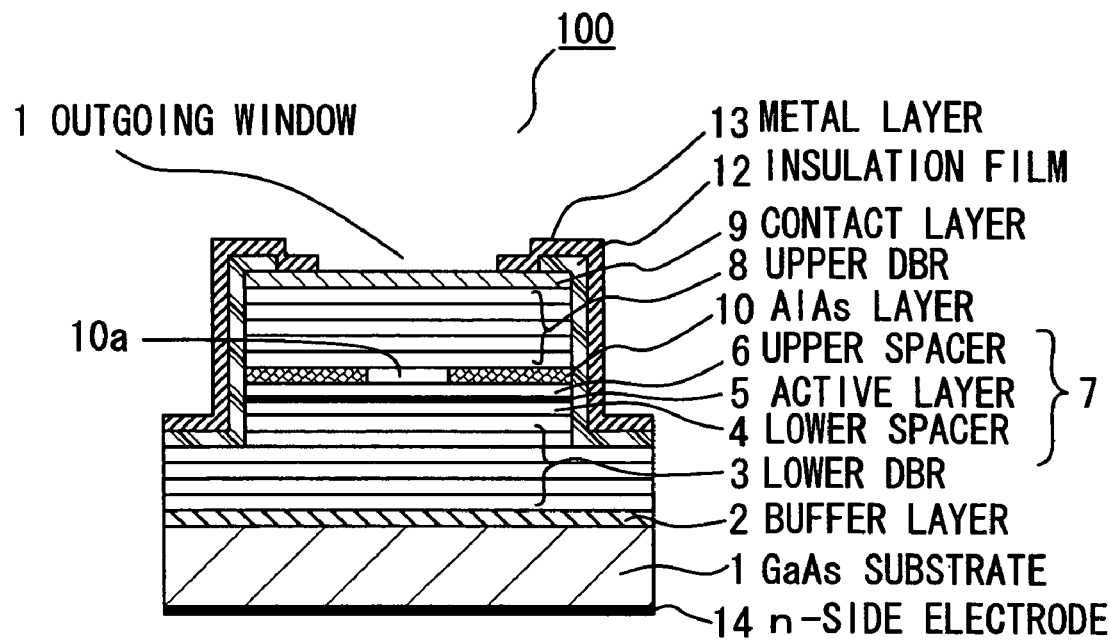
FIG. 1A is a cross-sectional view of a surface emitting semiconductor device according to a first embodiment of the present invention, wherein the cross-sectional view is taken along a line X—X shown in FIG. 1B.
Figure 1B:
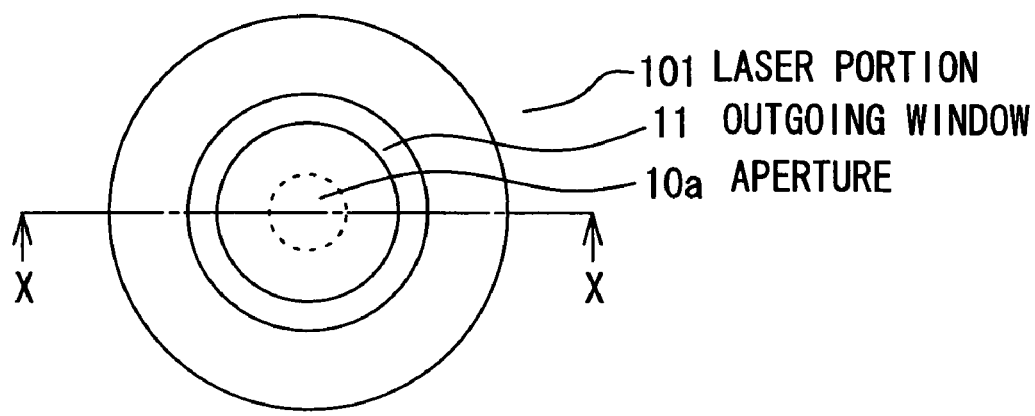
FIG. 1B is a plan view of the surface emitting semiconductor laser shown in FIG. 1A.

FIG. 1A is a cross-sectional view of a surface emitting semiconductor laser according to a first embodiment of the present invention, and FIG. 1B is a plan view thereof. The present embodiment is a selective oxidization type surface emitting semiconductor laser 100 equipped with a laser portion 101 having a cylindrical mesa structure (post structure or pillar structure). A protection film that covers the laser portion (mesa) 101 and a bonding pad portion that extends from a metal contact layer are omitted from illustration for the sake of simplicity.

The laser 100 has an n-type GaAs substrate 1, on which an n-type buffer layer 2 is provided. An n-type lower DBR (Distributed Bragg Reflector) 3 is provided on the buffer layer 2. On the lower DBR 3, laminated are an undoped lower spacer layer 4, an undoped quantum well active layer 5, and an undoped upper spacer layer 6 in this order. An active region 7 is formed so as to include the layers 4, 5 and 6. A p-type upper DBR 8 and a p-type contact layer 9 are laminated on the active region 7 in this order. The lowermost layer of the upper DBR 8 is a p-type AlAs layer 10, which serves as a current confinement layer equipped with a circular aperture 21 surrounded by an oxidized region.

A contact layer 9 is formed on the upper DBR 8. An interlayer insulation film 12 covers the bottom and side surfaces of the mesa as well as part of the top surface thereof. A metal layer 13 is formed on the interlayer insulation film 12. The metal layer 13 makes an ohmic contact with the contact layer 9, and serves as a p-side electrode for injecting current to the laser portion. An n-type backside electrode 14 is provided on the back surface of the substrate 1. A circular aperture is formed in the metal layer 13 so as to be located in the center thereof. This aperture serves as an outgoing window 11 via which laser is emitted outwards. The center of the outgoing window 11 is aligned with the aperture of the current confinement layer 10, and substantially coincides with the optical axis that extends from the substrate vertically and passes through the center of the laser portion 101.

The lower DBR 3 is a multiple laminate of n-type $Al_{0.9}Ga_{0.1}As$ layers and $Al_{0.3}Ga_{0.7}As$ layers, each of which has a thickness $\lambda/4n_r$ where $\lambda$ is the oscillation wavelength and $n_r$ is the refractive index of the medium. The paired layers having different composition ratios are alternately laminated to a thickness of 40.5 periods. The carrier concentration of the lower DBR 3 is $3\times10^{18}$ cm$^{-3}$ after silicon that is an n-type impurity is doped.

In the active region 7, the lower spacer layer 4 is an undoped $Al_{0.6}Ga_{0.4}As$ layer. The quantum well active layer 5 includes an undoped $Al_{0.1}Ga_{0.89}As$ quantum well layer and an undoped $Al_{0.3}Ga_{0.7}As$ barrier layer. The upper spacer layer 6 is an undoped $Al_{0.6}Ga_{0.4}As$ layer.

The upper DBR 8 is a multiple laminate of p-type $Al_{0.9}Ga_{0.1}As$ layer and p-type $Al_{0.3}Ga_{0.7}As$ layers, each having a thickness $\lambda/4n_r$ where $\lambda$ is the oscillation wavelength and $n_r$ is the refractive index of the medium. The paired layers having different composition ratios are alternately laminated to a thickness of 30 periods. The carrier concentration of the upper DBR 8 is $3\times10^{18}$ cm$^{-3}$ after carbon that is a p-type impurity is doped.

The p-type contact layer 9 is a GaAs layer and is 20 nm thick. The carrier concentration of the p-type contact layer 9 is $1\times10^{20}$ cm$^{-3}$ after carbon that is a p-type impurity is doped. The metal layer 13, which serves as the p-side electrode, is a laminate of Ti/Au.

Although not shown in FIGS. 1A and 1B, in order to reduce the series resistance of the laser portion, practically, an intermediate (graded) layer having an intermediate mixed crystal ratio of GaAs/AlAs between the p-type $Al_{0.9}Ga_{0.1}As$ layer and the p-type $Al_{0.3}Ga_{0.7}As$ layer may be provided on the upper DBR 8 or below the lower DBR 3.

A description will now be given of a method of fabricating the surface emitting semiconductor laser shown in FIGS. 1A and 1B. In the present embodiment, a monitor-use stripe pattern having semiconductor layers is formed in the center of the substrate 1, and semiconductor layers for laser portions are arranged around its periphery. In the figures described blow, physical relations mentioned above are omitted, and a process for simultaneously forming semiconductor layers for laser portions and monitor-use semiconductor layers on the substrate 1 are schematically illustrated.

Figure 2A:
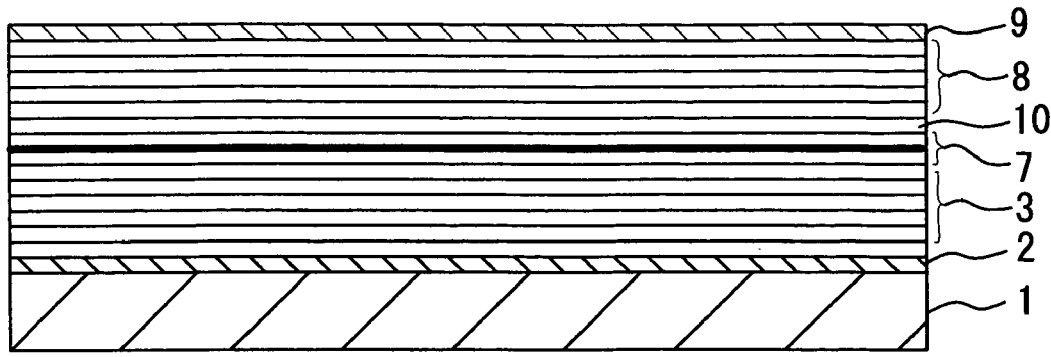
FIGS. 2A, 2B and 2C are cross-sectional views of steps of a method of fabricating the surface emitting semiconductor laser shown in FIGS. 1A and 1B.
Figure 2B:
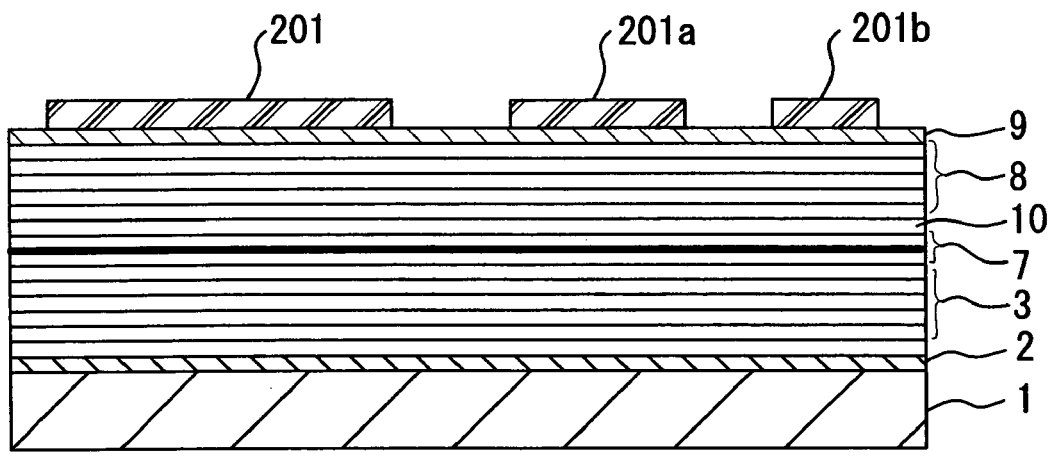

As shown in FIG. 2A, the buffer layer 2, the lower DBR 3, the active region 7, the upper DBR 8 and the contact layer 9 are laminated on the substrate 1 in this order. As shown in FIG. 2B, silicon oxide layers 201, 201a and 201b are formed on the contact layer 9 by patterning. The silicon oxide layer 201 is a mask layer for forming the mesa of the laser portion 101. The silicon oxide layers 201a and 201b are mask layers for forming mesas that are semiconductor layers for use in monitoring. The mesa of the laser portion 101 is a cylindrical pillar, while the monitor-use semiconductor layers are like a slender stripe. The silicon oxide layer 201 is shaped into a circular pattern, and the silicon oxide layers 201a and 201b are shaped into slender patterns. The cross section of FIG. 2B shows the short-side widths of the silicon oxide layers 201a and 201b, wherein the short-side width of the silicon oxide layer 201b is shorter than that of the silicon oxide width 201a. The widths of the silicon oxide layers 201a and 201b are shorter than the diameter of the silicon oxide layer 201.

Figure 2C:
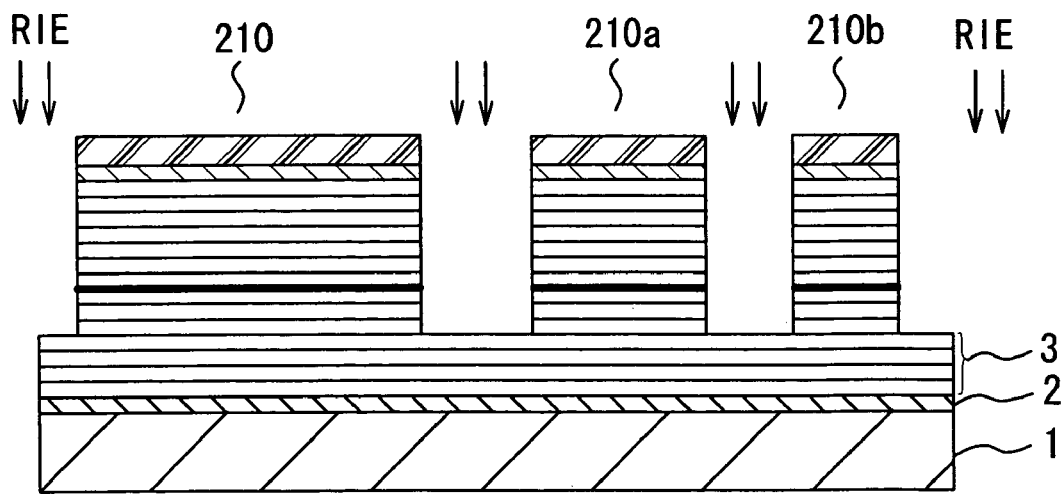

As shown in FIG. 2C, a laminate ranging from the contact layer 9, the upper DBR 8, the active region 8 and part of the lower DBR 3 is anisotropically etched by reactive ion etching (RIE) with a mixed gas of boron trichloride and chlorine ($BCl_3$ and $Cl_2$). This anisotropic etching uses the silicon oxide films 201, 201a and 201b as masks, and defines a laser-use mesa 210 and monitor-use mesas 210a and 210b. It is not necessarily required to cause etching to advance up to the lower DBR 3 but to expose at least the side surface of the AlAs layer 10. For example, etching of up to the active layer 5 of the active region 7 may be accepted.

The mesa 210 of the laser portion 101 is like a cylindrical pillar, and the monitor-use mesas 210a and 210b are like slender rectangular parallelepipeds. The long-side widths of the mesas 210a and 201b are much longer than the short-side widths thereof. The two mesas 210a and 210b having the different widths are paired, and multiple pairs of mesas are arranged at given pitches in the center of the substrate 1 so as to form straight stripes.

Figure 3A:
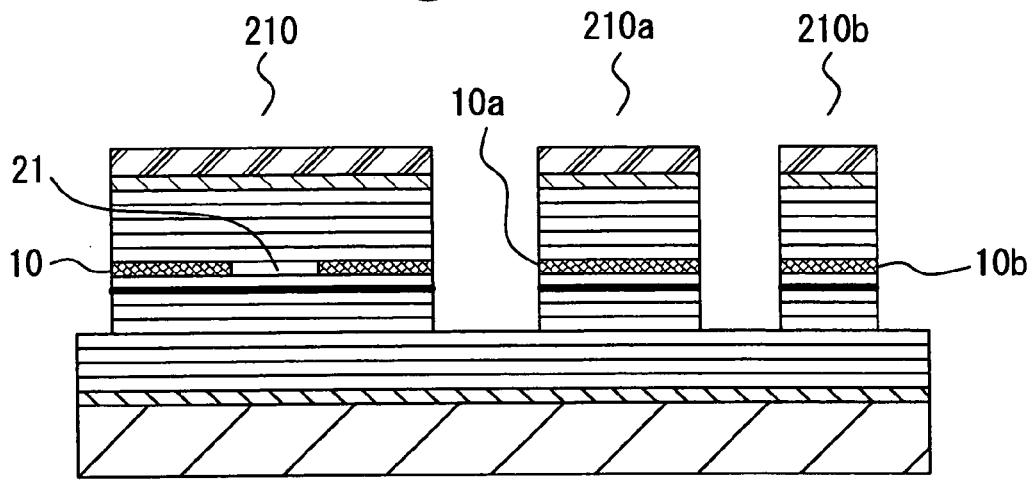
FIGS. 3A, 3B and 3C are cross-sectional views of steps of a method of fabricating the surface emitting semiconductor laser shown in FIGS. 1A and 1B.

Next, oxidization of the AlAs layer (current confinement layer) 10 of the mesa 210 is started (FIG. 3A). This oxidization uses wet oxidization in which a water vapor obtained by bubbling pure water heated to 95° C. is transported to a wet oxidization chamber with nitrogen being used as carrier gas. The substrate is put in the oxidization chamber in advance and the in-chamber temperature is set at approximately 340° C. The AlAs layers included in the mesas 210 and 210a and 210b are oxidized from the side surfaces thereof.

Figure 6:
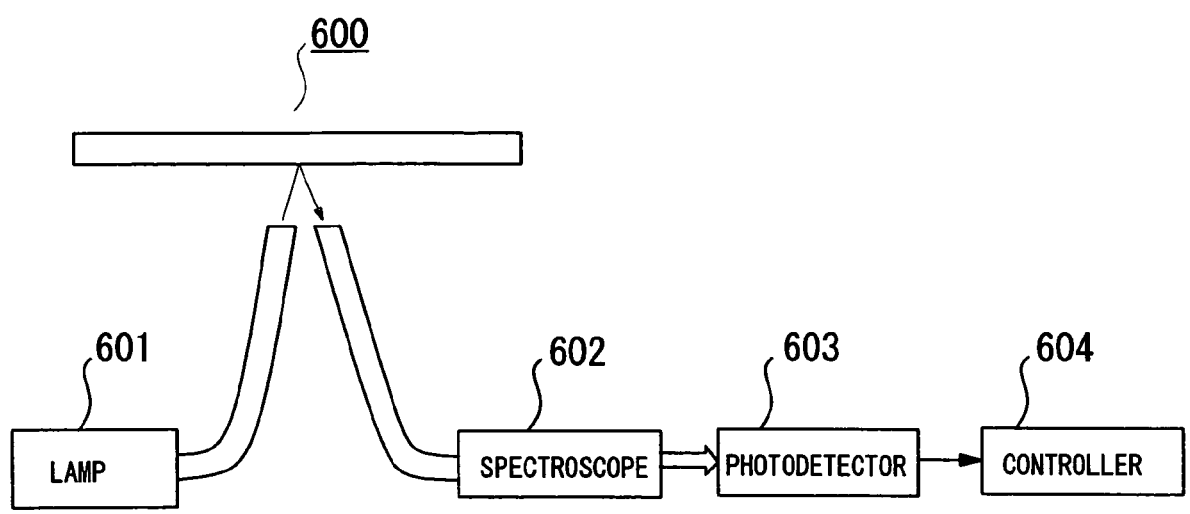
FIG. 6 is a block diagram of an oxidization control apparatus according to an embodiment of the present invention.

In the present embodiment, in order to control the oxidization reaction on the AlAs layer 10, namely, the size of the aperture 21 thereof, oxidized conditions of the AlAs layers 10a and 10b of the mesas 210a and 210b are monitored, and the terminating time of oxidization of the AlAs layer 10 is estimated on the basis of the oxidized conditions of the AlAs layers 10a and 10b. This control may be accomplished by an oxidization control apparatus 600 shown in FIG. 6. The apparatus 600 includes a lamp 601, a spectroscope 602, a photodetector 603, and a control unit 604. The lamp 601 projects light in the wavelength range of 400–1100 nm onto the area including the stripe pattern of the mesas 210a and 210b on the substrate 1. The spectroscope 602 optically splits reflected light from the stripe pattern into given wavelengths. The photodetector 603 is a light-receiving element such as a photodiode, and converts split lights into electrical signals. The control unit 604 monitors the signals from the photodetector 603, and controls oxidization of the AlAs layer of the mesa 210.

When AlAs (or AlGaAs) is oxidized, $AlO_x$ is formed in the oxidized portion, which is an insulator, and has a reflectance different from that of AlAs. For instance, the average reflectance in the wavelength range of 800–1000 nm is 0.45 for AlAs and is 0.58 for $AlO_x$. Thus, by measuring the average reflectance of the AlAs layer in progress of oxidization, it is possible to track the degree of progress of oxidization reaction on the AlAs layer.

Figure 4:
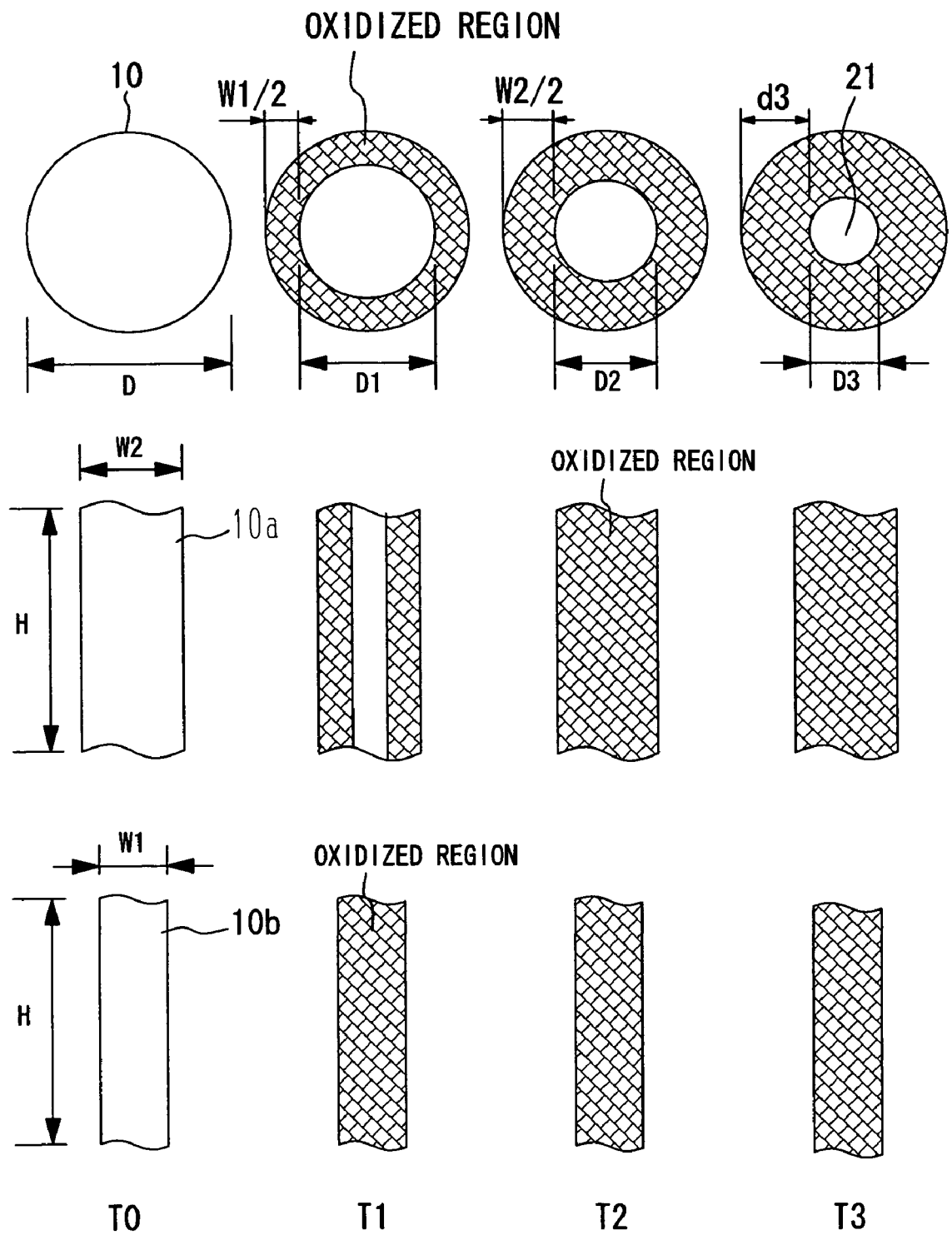
FIG. 4 illustrates oxidized conditions on an AlAs layer of a laser-use mesa and oxidized conditions of an AlAs layer of a monitor-use mesa.
Figure 5:
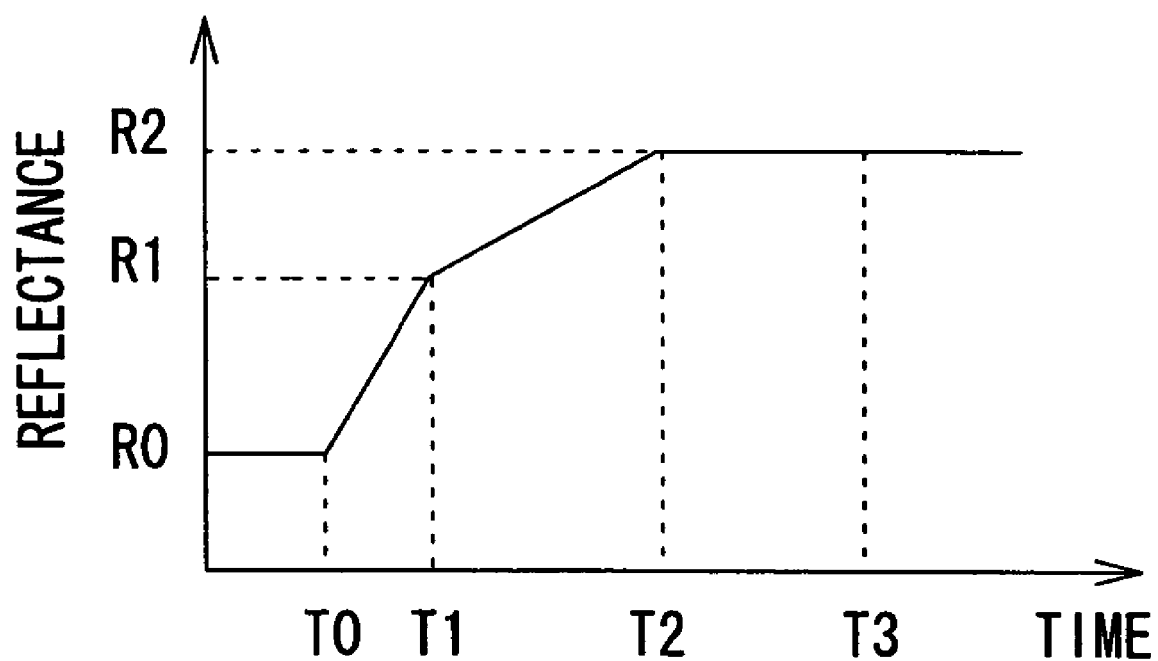
FIG. 5 is a graph of a relation between an average reflectance involved in a monitor-use stripe pattern and oxidization time.

FIG. 4 shows various oxidized conditions of the AlAs layer 10 of the mesa 210 that forms the laser portion 101, and various oxidized conditions of the AlAs layers 10a and 10b of the monitor-use mesas 210a and 210b. FIG. 5 is a graph of an average reflectance vs. oxidization time characteristic of a stripe pattern for use in monitoring.

The planer pattern (oxidizable region) of the AlAs layer 10 of the mesa 210 for the laser portion 101 has a circular shape, and has a diameter D prior to oxidization.

The planer pattern (oxidizable region) of the AlAs layer 10a of the monitor-use mesa 210a has a width W2 on the short side and a height (length) H on the long side. Similarly, the planer pattern of the AlAs layer 10b of the monitor-use mesa 210b has a width W1 on the short side and the same height (length) H on the long side as that of the monitor-use mesa 210a. These patterns have a relation such that W1<W2<D, W1<<H, and W2<<H.

In FIGS. 4 and 5, at the oxidization starting time T0, oxidization of the AlAs layers 10, 10a and 10b of the mesas 210, 210a and 210b has not yet been started, and the average reflectance from the stripe pattern is at an initial value R0. The planer patterns of the AlAs layers 10, 10a and 10b are shown as blank areas in FIG. 4. After oxidization starts, oxidization of the AlAs layer 10 of the mesa 210 evenly advances inwards from its side surface. In FIG. 4, oxidized areas are illustrated with hatching. Simultaneously, oxidization of the AlAs layers 10a and 10b of the mesas 210a and 210b evenly advances inwards from the side surfaces thereof. Since the heights H of the monitor-use mesas 210a and 210b are much longer than the widths W1 and W2, it can be considered that oxidization of the AlAs layers 10a and 10b advances from the opposing long sides H of the mesas 210a and 210b.

The AlAs layers 10, 10a and 10b are oxidized at the same rate of oxidization from time T0. When the oxidizable region of the AlAs layer 10b of the mesa 210b is totally oxidized, in other words, when the width W2 of the mesa 210b is totally oxidized, a unique waveform that reflects the ratio of variation of the reflectance from the stripe pattern for monitoring is observed. Oxidization of the mesa 210b does not advance any more. This results in a turning point R1 at which inclination of the average reflectance becomes small. The turning point R1 takes place at time T1. At time T1, oxidization of the AlAs layer 10a of the mesa 210a has advanced for a distance of W1/2 from the opposing sides, and a non-oxidized region (W2–W1) remains in the center thereof. In FIG. 4, the region that has been oxidized is illustrated as a hatched area, and the non-oxidized region is illustrated as a blank area. Oxidization of the mesa 210 of the laser portion 101 has advanced for a distance of W1/2 from the sidewall thereof, and a non-oxidized region of an aperture D1 (=D–W1) remains in the center thereof.

When the AlAs layer 10a of the mesa 210a is totally oxidized, a turning point R2 takes place at which the inclination of the average reflectance from the stripe pattern of the monitor-use mesa 210a further changes. This is because oxidization of the mesa 210a is completed and does not advance any more. The turning point R2 takes place at oxidization time T2. At time T2, oxidization of the mesa 210 of the laser portion 101 has advanced for a distance of oxidization distance W2/2 from the sidewall thereof, and a non-oxidized region of an aperture D2 (=D–W2) remains at the center.

According to an aspect of the present invention, oxidization terminating time T3 for forming designed oxidization distance d3 (namely, an aperture having diameter D3) in the AlAs layer 10 on the basis of the times T1 and T2 at which the turning points R1 and R2 of the average reflectance are obtained.

The widths W1 and W2 of the mesas 210a and 210b for use in monitoring are known, and the times T1 and T2 can be obtained from the turning points R1 and R2. Thus, it can be seen that oxidization advances for a distance $\Delta d=(W2-W1)/2$ during a time $\Delta T=T2-T1$. It will be noted that "½" is provided taking into consideration that oxidization simultaneously advances from the both sides of each mesa. The rate of oxidization of the AlAs layer can be obtained from the time $\Delta T$ and oxidization distance $\Delta d$. From the above relation, time T3 at which oxidization advances to the designed oxidization distance d3 can be obtained as follows:

$$T3 = T2 + \Delta T/\Delta d(d3 - W2/2).$$

By terminating the oxidization process when time T3 elapses, it is possible to form the aperture 21 having the designed oxidization distance d3 or dimensional accuracy D3 in the mesa 210 on the laser portion 101. The above-mentioned oxidization control process is carried out by the control apparatus 604, and is preferably programmed in the form of software stored therein.

After the oxidization process, as shown in FIG. 3A, part of the AlAs layer 10 of the mesa 210 is selectively oxidized, and the aperture 21 is formed in the center of the current confinement layer 10.

Figure 3B:
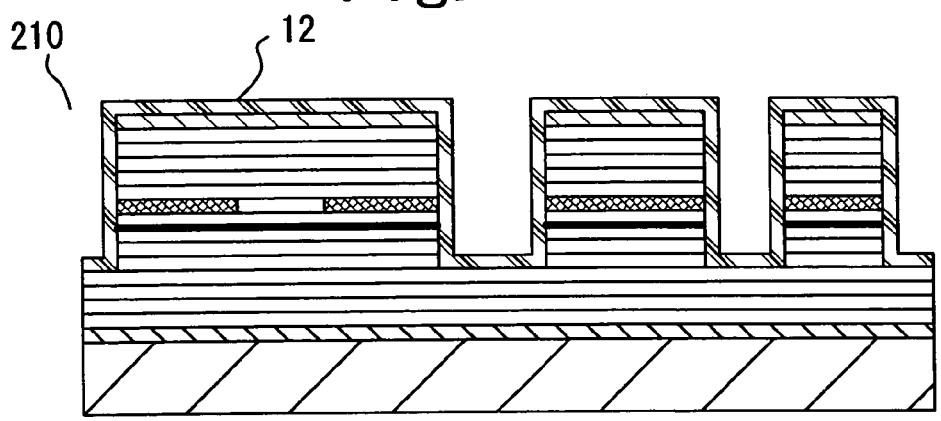
Figure 3C:
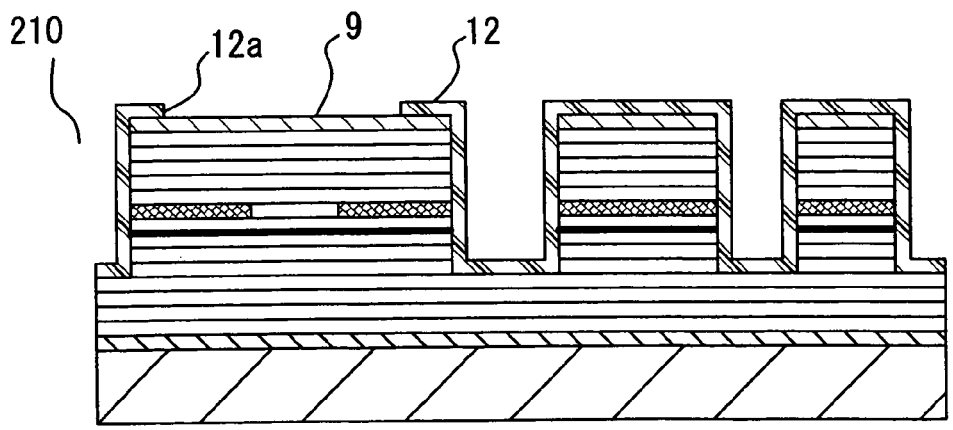

Turning to FIG. 3B, the silicon oxide layers 201, 201a and 201b used as the etching masks are removed, and the interlayer insulation film 12 is formed so as to form the mesa 210. Of course, it is not necessary to apply subsequent processes to the monitor-use mesas 210a and 201b in the same manner as the mesa 210.

Then, the aperture 12a is formed in the interlayer insulation film 12 on the top of the mesa 210, and the metal layer 13 is provided thereon. An aperture serving as the outgoing window 11 is formed in the center of the metal layer 13, and the n-side backside electrode 14 is formed on the back surface of the substrate 1.

According to the present embodiment, two kinds of mesa-like semiconductor layers having different widths (W1, W2) are provided for use in monitoring oxidization, and attention is paid to unique waveform changes of the reflectance when the mesas 210a and 210b have been totally oxidized. The detection of the unit waveform change makes it possible to accurately monitor and track the progress of oxidization on the monitor-use mesas.

Figure 7:
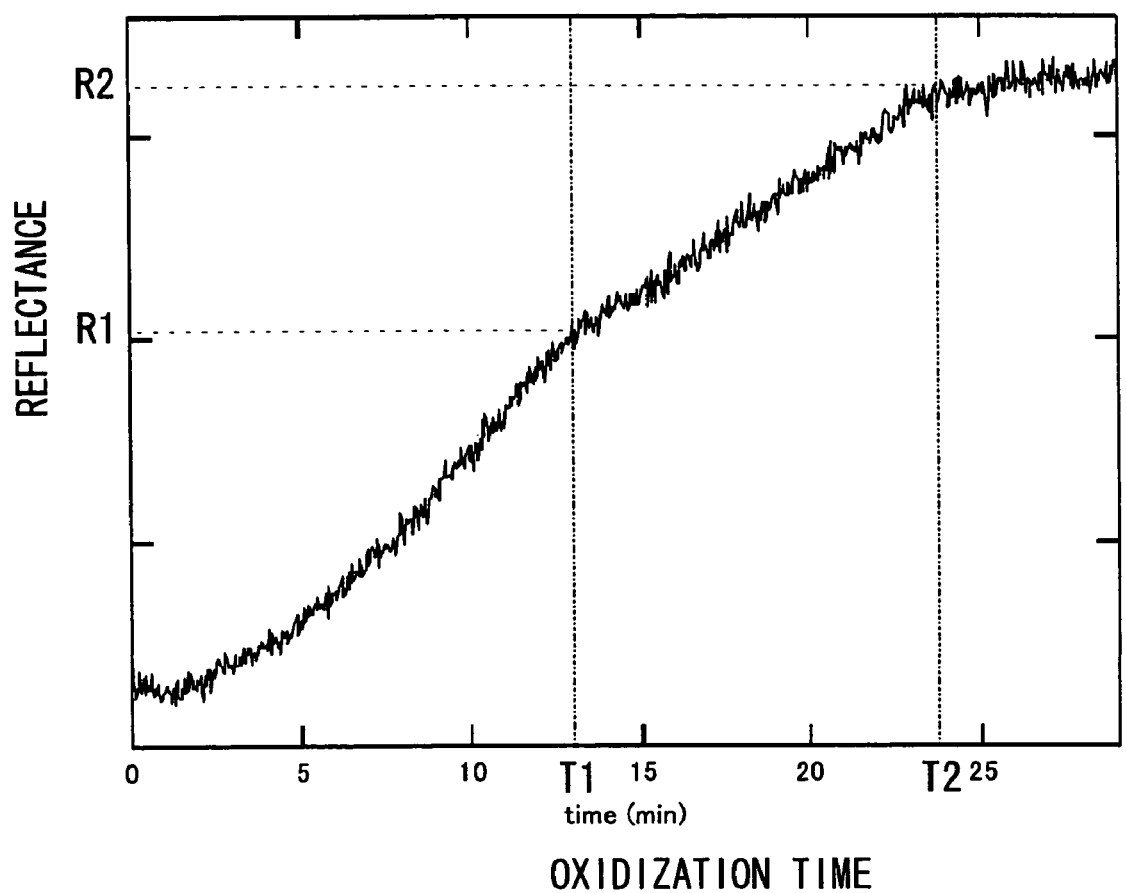
FIG. 7 is a graph illustrating an average reflectance vs. oxidization time characteristic measured when two kinds of monitor-use mesas are used.

FIG. 7 shows measurement results obtained when the two kinds of monitor-use mesas are actually employed. The two kinds of mesas that form stripe patterns having widths W1 of 9 μm and 18 μm, respectively, and are subject to an oxidization control in which the oxidization temperature is set at 370° C. and the oxidization distance d3 is set equal to 11 μm. The two different mesas form a pattern of a pair of stripes. Multiple pairs of stripes are disposed in the center of the substrate 1. The aforementioned oxidization control apparatus 600 initiates the oxidization process for the substrate 1, and commences to project white light from the lamp 601 onto the area including the pairs of stripes arranged in the center of the substrate 1. Reflected light from the substrate 1 is split into lights of the given wavelengths by the spectroscope 602, which lights are then monitored.

In FIG. 7, the vertical axis denotes the reflectance, and the horizontal axis denotes the oxidization time. The reflectance of the vertical axis may be replaced with the output of an equivalent electrical signal obtained by photoelectric conversion of a selected one of the split lights. It can be seen from FIG. 7 that the first explicit change of the reflectance after initiation of oxidization takes place when the monitor-use mesa having the comparatively small width W1 (equal to 9 μm) has just been oxidized totally (time T1), and that the second explicit change of the reflection occurs when the other monitor-use mesa having the comparatively large width W2 (equal to 18 μm) has just been oxidized totally (time T2).

It is possible to determine which one of the split lights or wavelengths from the spectroscope 602 should be selected to monitor the reflectance of its change by taking into account the patterns, sizes and laminate structures of the monitor-use mesas or oxidization environment. Preferably, one of the split lights or wavelengths that exhibits remarkable change in the reflectance should be selected.

Figure 8A:
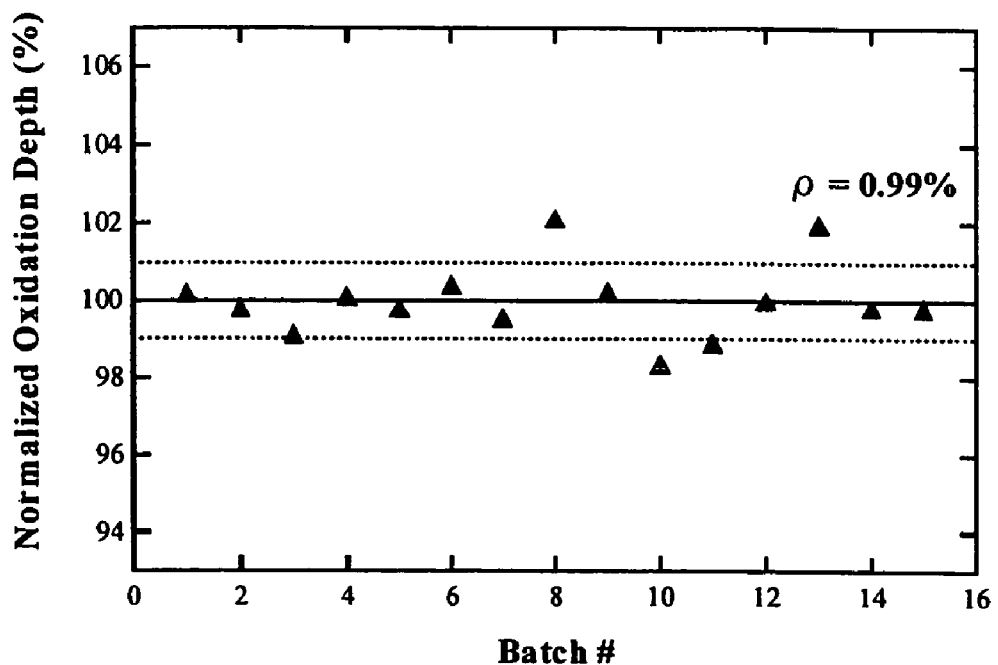
FIG. 8A is a graph showing accuracy of oxidization distance d3 obtained when two kinds of monitor-use mesas according to an embodiment of the present invention are used.
Figure 8B:
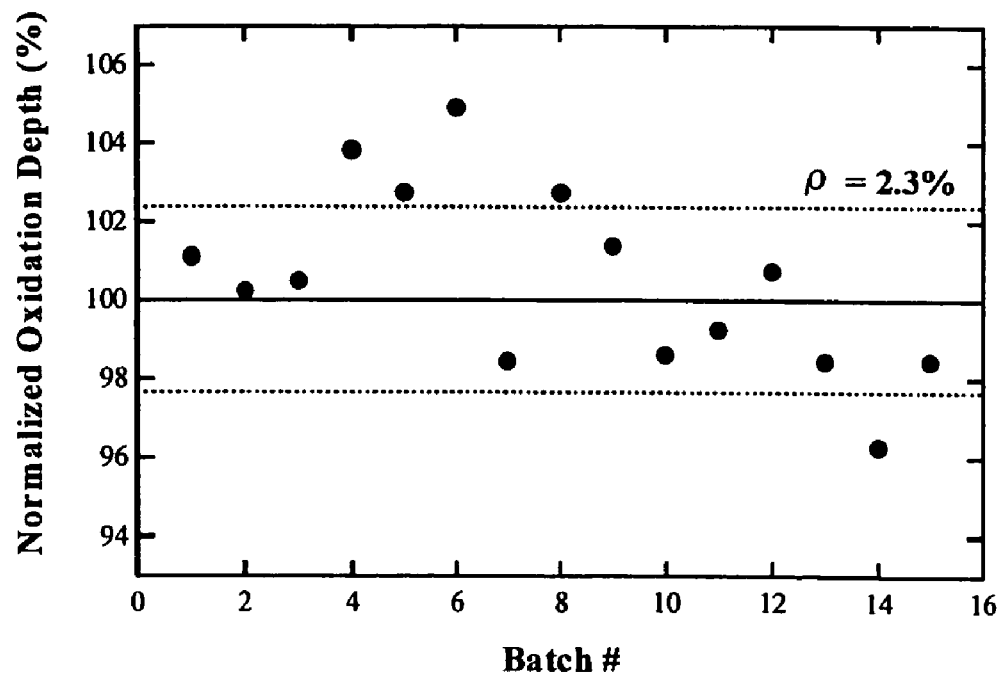
FIG. 8B is a graph showing accuracy of oxidization distance obtained when a single kind of monitor-use mesa is used.

FIG. 8A shows the accuracy of the oxidization distance d3 obtained when the two kinds of monitor-use mesas according to the present embodiment are used, and FIG. 8B shows the accuracy of the oxidization distance obtained when only one monitor-use mesa is used. The horizontal axes of FIGS. 8A and 8B denote the lot numbers of substrates subject to a batch process, and the vertical axes thereof denote normalized oxidization depths formed in the mesa 210. As is seen from FIG. 8A, the oxidization distance formed in the mesa 210 is regulated within a range of about 2%, and the standard deviation ρ is equal to 0.99%. In contrast, in the conventional oxidization control shown in FIG. 8B, the oxidization distance (which corresponds to the oxidization distance d3) is regulated within a broader range of about 5%, and the standard deviation ρ is equal to 2.35%. It can be seen from the above that the use of the two kinds of monitor-use mesas for estimating the oxidization distance d3 from the respective oxidization terminating times makes it possible to more accurately control the oxidization distance d3 or the aperture D3.

In the present embodiment, the stripes of the two kinds of mesas or semiconductor layers for monitoring are formed on the substrate (or wafer) separate from the laser portion 101. Instead of the above-mentioned stripes, it is possible to employ stripes respectively formed by cylindrical mesas. For example, the mesas 210a and 210b for use in monitoring may be structured so that the AlAs layers 10a and 10b have an oval, ellipse or polygonal planer shape. Similarly, the mesa of the laser portion 101 is not limited to the cylindrical post, but may be a square or rectangular post. The present invention does not necessarily need the straight stripes, but any pattern formed by a pair of stripes of the mesas 210a and 210b may be used.

Figure 9A:
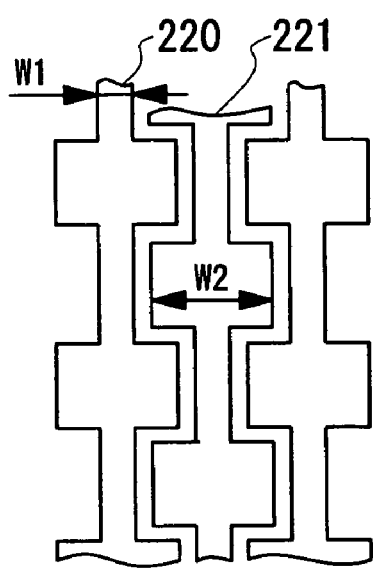
FIGS. 9A and 9B are respectively plan views of variations of the two kinds of monitor-use mesas.
Figure 9B:
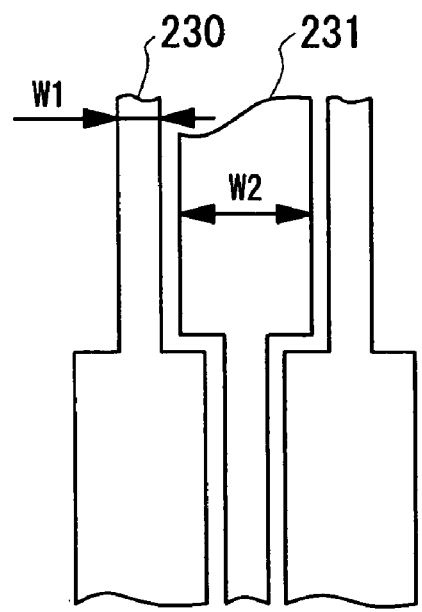

FIGS. 9A and 9B respectively show variations of the monitor-use mesas. The two kinds of mesas for use in monitoring do not essentially require physical separation. For instance, as shown in FIG. 9A, a mesa 220 for monitoring has a pattern having regions of widths W1 and W2. It is also possible to interpose another mesa 221 having the same pattern as that of the mesa 220 between integrally formed stripes of the mesa 220 so that the widths W1 and W2 of the mesa 220 face the widths W2 and W1 of the mesa 221, respectively. As shown in FIG. 9B, mesas 231 and 232 for monitoring are alternately arranged. As described above, even when the mesas have the same pattern, these mesas can be arranged so as to substantially have two kinds of mesas for use in monitoring. In short, it is enough to have at least two kinds of oxidization regions having different widths, sizes or dimensions.

Second Embodiment

Figure 10A:
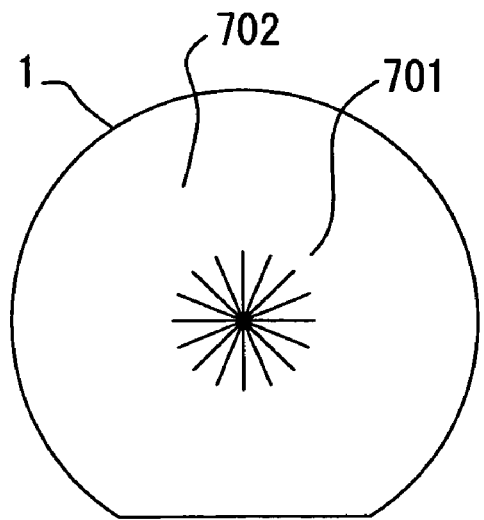
FIGS. 10A and 10B are respectively plan views of radiating stripe patterns according to a second embodiment of the present invention.
Figure 10B:
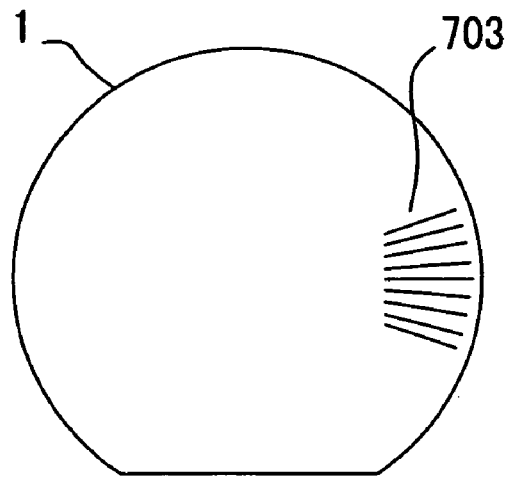

A description will now be given of a second embodiment of the present invention. In the foregoing, the monitor-use mesas are arranged so as to form a stripe pattern in the center of the substrate. In contrast, according to the second embodiment of the present invention, a stripe pattern 701 that has stripes radiating from the center of the substrate 1 is used, as shown in FIG. 10A. The radial stripe pattern 701 includes multiple pairs of mesas, each pair having two kinds of mesas having different widths W1 and W2 as in the case of the first embodiment. Multiple mesas 702 that respectively form laser portions are arranged around the stripe pattern 701.

In the process following the formation of mesas, an etching mask of resist in the photolithographic process is used to define the aperture 12a of the interlayer insulation film 12 and the outgoing window 11 of the metal layer 13. The process of forming the resist includes spin coating in which resist is dropped towards the substrate 1 that is rotating. In this spin coating, resist dropped on the substrate may move smoothly along the stripe pattern 701 of the stripes radiating from the center of the substrate 1 and having symmetry with respect to the center. It is therefore possible to deposit the resist having an even film thickness over the substrate 1. By enhancing the accuracy of the resist mask, it is possible to improve the accuracy of positioning the aperture 12a and the outgoing window 11 and align them with the optical axis of the laser portion 101.

The present invention is not limited to the two kinds of mesas having different widths, but may use a monitor-use pattern of radial strips each having the same width.

Figure 11A:
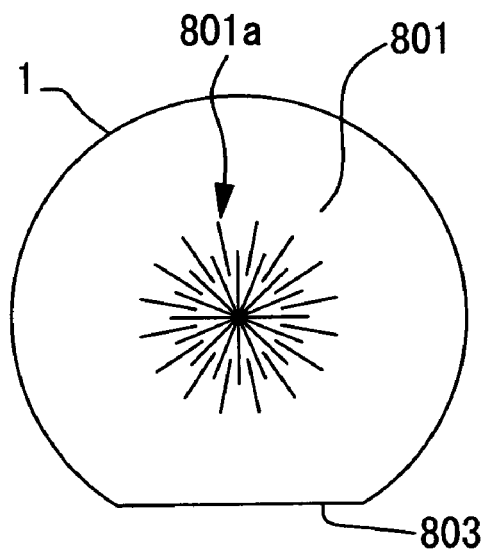
FIGS. 11A and 11B are plan views of variations of the radiating stripe patterns shown in FIGS. 10A and 10B.
Figure 11B:
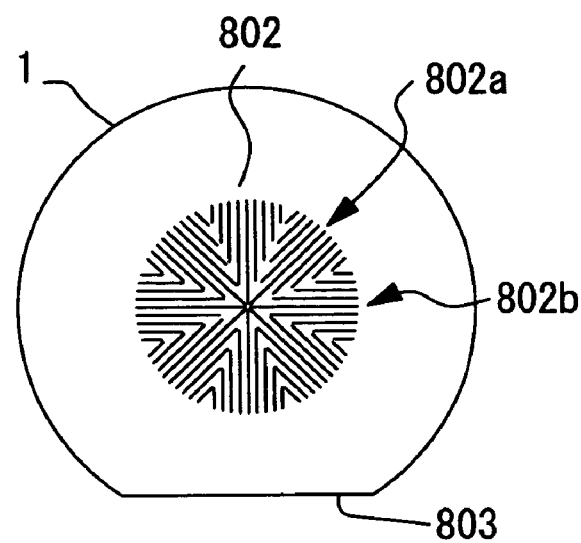

FIGS. 11A and 11B show modified examples of the monitor-use mesas. A radial stripe pattern 801 shown in FIG. 11A is a modification of the radial stripe pattern 701 shown in FIG. 10A. The radial pattern 801 shown in FIG. 1A includes isolated patterns 801a, each of which is interposed between two stripes radiating from the center. The pattern density on the outer side of the radial stripe pattern can be increased by the isolated patterns 801a. An increased pattern density on the outer side of the radial stripe pattern reduces the bottom areas of the mesas, and light reflected from the stripe pattern includes reduced reflected light from the bottom areas of the mesas, so that noise contained in the signal can be reduced and error in the reflectance measurement can be reduced.

A semi-radial stripe pattern 802 shown in FIG. 11B may be used. The semi-radial stripe pattern 802 has divided groups, each of which has a center angle of 45° and includes a pattern of straight stripes. The patterns of straight stripes of the divided groups are arranged so as to form an angle of 45°. For example, a pattern 802a includes straight stripes extending at an angle of 45° with respect to an orientation flat 803 of the wafer or substrate, and a pattern 802b includes straight stripes extending in parallel with the orientation flat 803. The divided groups are arranged so that the straight stripes of the adjacent groups form an angle of 45°. The semi-radial pattern 802 has reduced dispersion of the stripe width as compared to the radial pattern shown in FIG. 9A, and has an extremely increased pattern density as compared to the radial pattern shown in FIG. 8A.

Figure 12A:
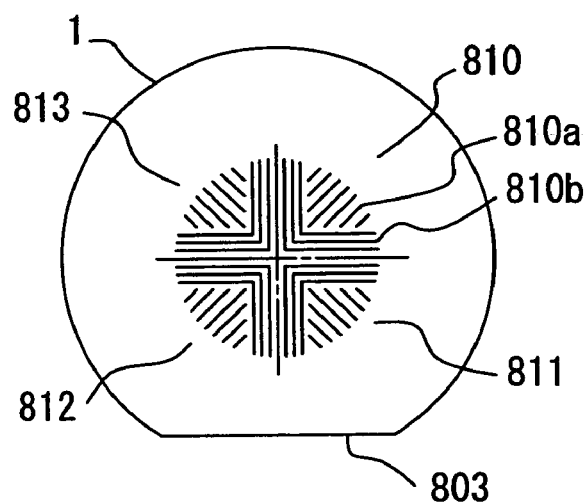
FIGS. 12A, 12B and 12C are plan views of other variations of the radiating stripe patterns shown in FIGS. 10A and 10B.
Figure 12B:
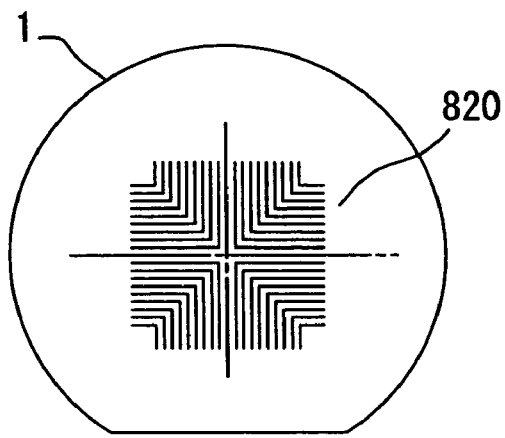
Figure 12C:
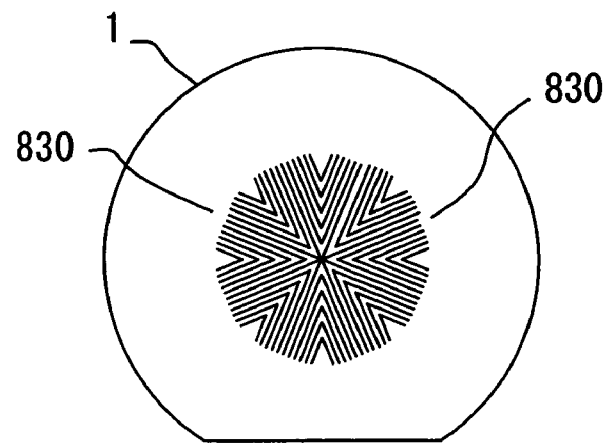
Figure 13:
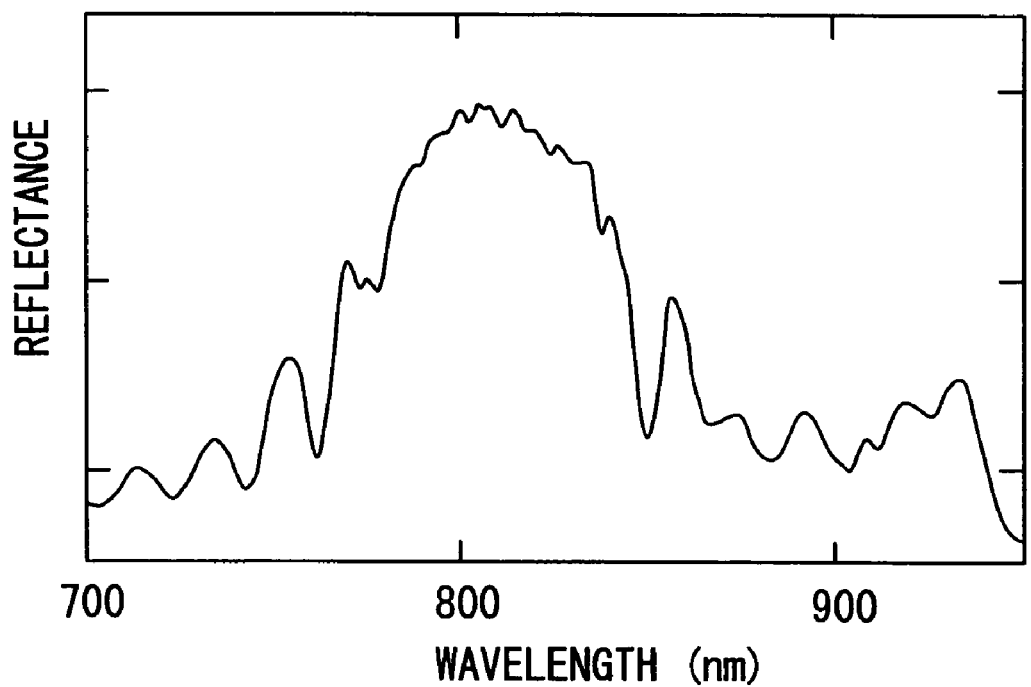
FIG. 13 is a graph showing a relation between the wavelength of light projected onto a conventional monitor-use sample and reflectance.
Figure 14:
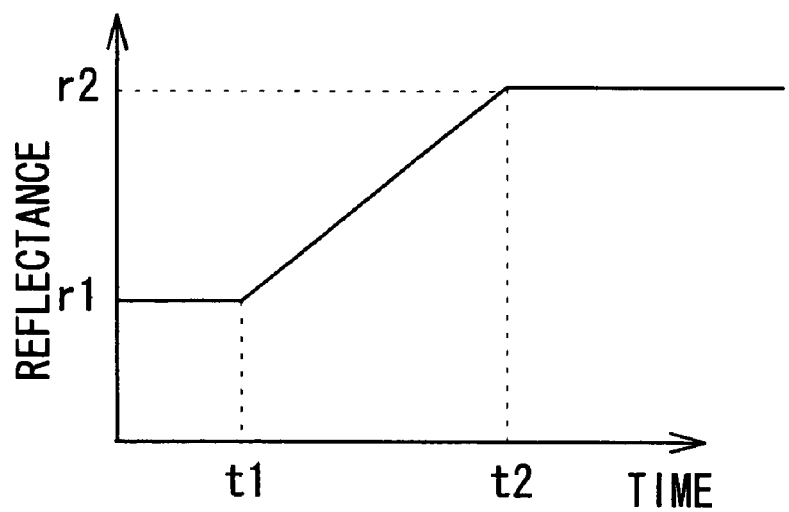
FIG. 14 is a graph showing an oxidization control method that is carried out when the conventional monitor-use sample is used.
Figure 15:
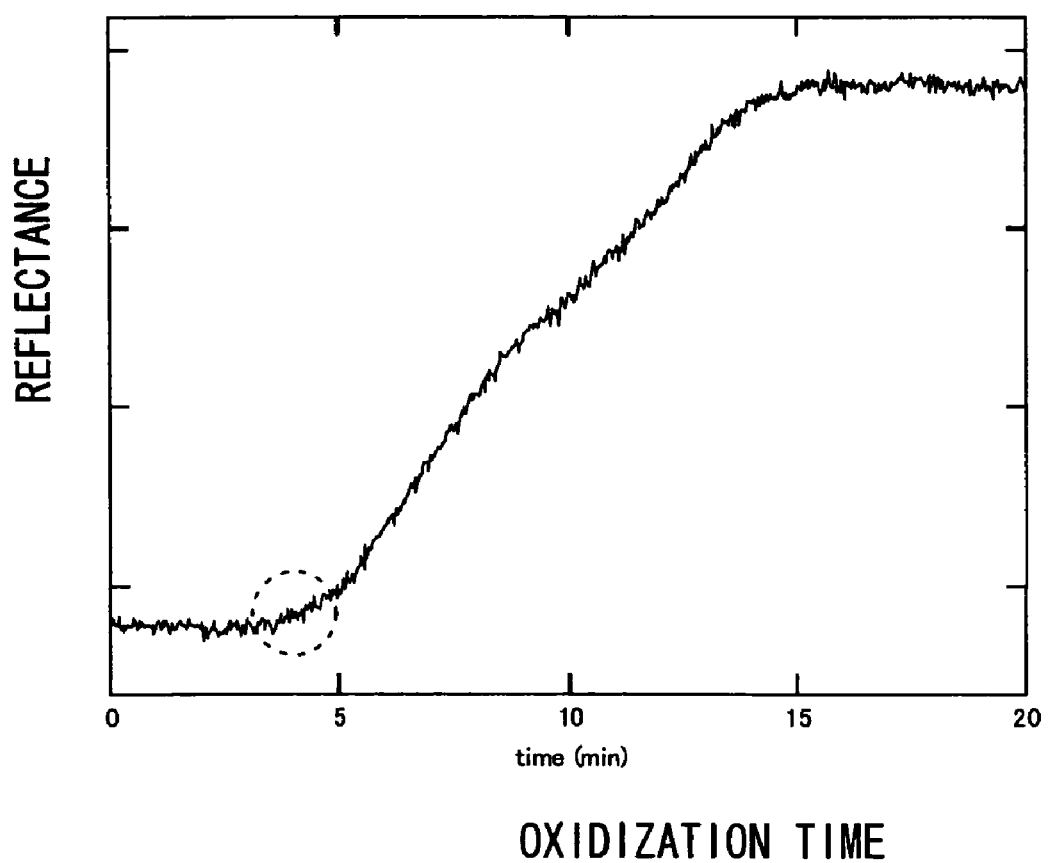
FIG. 15 is a graph showing a relation between the reflectance and oxidization time obtained when the conventional monitor-use sample is used.

FIGS. 12A through 12C respectively show variations of the radial stripe pattern. A pattern shown in FIG. 12A includes stripe patterns 810, 811, 812 and 813, which are arranged on the substrate 1 with rotational symmetry. Each of the stripe patterns 810–813 includes stripes 810a radiating from the center of the substrate 1 and stripes 810b extending in the direction perpendicular to the orientation flat 803 of the substrate 1. A pattern shown in FIG. 12B includes four right-angle patterns 820 with rotational symmetry. A pattern shown in FIG. 12C has four 45° inclined patterns 830 with rotational symmetry. Any of the patterns shown in FIGS. 12A through 12C bring about the same effects as the radial patterns. The straight stripes of the patterns 810b, 820 and 830 are not necessarily required to cross at the ends, but may be spaced apart from each other at a given distance. The monitor-use mesas that form the patterns 810b, 820 and 830 may be varied so as to have pairs of mesas arranged at given intervals, each of which pairs has two kinds of mesas having different widths. It is also possible to form a stripe pattern with mesas each having the same width.

The present invention is not limited to the specifically described embodiments, but other embodiments, variations and modifications may be made without departing from the scope of the claimed invention.

Besides the cylindrical mesa is used for the laser portion 101 mentioned before, a mesa of a rectangular parallelepiped may be used. The monitor-used mesas are not limited to the stripe type but may have any shape.

In the foregoing, the monitor-use mesas are used for controlling oxidization of the current confinement layer 10. However, oxidization control is not limited to the use of the monitor-use mesas. For instance, light may be projected onto the mesa surface of the laser portion 101, and the oxidized condition on the current confinement layer (AlAs layer) may be monitored directly for oxidization control.

Besides the current confinement layer 10 of AlAs, a III–V semiconductor containing Al, such as AlGaAs, may be used. In the foregoing, the upper DBR 8 is of p-type and the lower DBR 3 is of n type. The above conduction types may be interchanged with each other. In a case where the outgoing light is extracted from the backside of the substrate 1, the upper DBR 8 is designed to have a larger number of layers than the lower DBR 3 and have a comparatively high reflectance.

The quantum well active layer is not limited to GaAs/AlGaAs-based semiconductors but may be made of, for example, GaAs/InGaAs-based semiconductors or GaAs/GaInNAs-based semiconductors. The emission wavelength of light emitted from the quantum well layer is transparent to the GaAs substrate 1. This allows the outgoing light to be taken from the backside of the substrate 1 and brings about a process merit. In the foregoing, the contact layer 9 and the upper DBR 8 are handled as separate layers in view of functions. However, the contact layer 9 is part of the upper DBR 8.

In the foregoing, the n-side electrode 14 is formed on the backside of the substrate 1. Alternatively, the n-type electrode may be provided on the semiconductor layer (for instance, the lower DBR 3) exposed in the mesa bottom on the substrate.

Finally, the above description is summarized below.

According to an aspect of the present invention, the method of fabricating a surface emitting semiconductor laser includes the steps of: forming a laser portion of semiconductor layers and at least two kinds of monitor-use semiconductor layers on a substrate, the laser portion including a first reflection mirror layer of a first conduction type, an active region, a III–V semiconductor layer containing Al and a second reflection mirror of a second conduction type, the at least two kinds of monitor-use semiconductor layers having oxidizable regions having different shapes; etching the laser portion so as to form a mesa on the substrate in which a side surface of the III–V semiconductor layer contained in the laser portion is exposed; starting oxidization of the III–V semiconductor layer from the side surface; monitoring a reflectance of each of the oxidizable regions of the at least two kinds of monitor-use semiconductor layers or its variation and obtaining, from results of monitoring, an oxidization terminating time at which oxidization of the III–V semiconductor layer in the laser portion should be terminated; and terminating oxidization of the III–V semiconductor layer at the oxidization terminating time to thus define an aperture that is a non-oxidized region of the III–V semiconductor layer.

By using the two kinds of semiconductor layers having different oxidizable regions, it becomes possible to accurately measure the turning points at which oxidization of the two kings of semiconductor layers are respectively completed. It is further possible to obtain information about the oxidization times and oxidization distances of the monitor-use semiconductor layers. The information can be used to estimate the oxidization terminating time related to the aperture that is to be formed in the III–V semiconductor layer of the laser portion. As a result, the aperture can be defined by highly reproducible process as designed.

Preferably, widths of the oxidizable regions of the at least two kinds of monitor-use semiconductor layers are smaller than a width of an oxidizable region of the III–V semiconductor layer of the laser portion, and the method further includes the steps of: obtaining a rate of oxidization of the oxidizable regions of the monitor-use semiconductor layers from variation in reflectance observed when the oxidizable regions of the monitor-use semiconductor layers are totally oxidized; and obtaining, from the rate of oxidization, a time when the aperture that is the non-oxidized region of the laser portion should be formed. The reflectance of the monitor-use semiconductor layers or its variation appears explicitly.

Therefore, the use of the reflectance or its variation contributes to detecting the oxidization rate more accurately and reducing error contained therein.

Preferably, the oxidizable regions of the at least two kinds of monitor-use semiconductor layers have widths W1 and W2 (W1<W2); the widths W1 and W2 are smaller than a diameter D of the oxidizable region of the III–V semiconductor layer of the laser portion; and the time when the aperture should be formed is obtained from the widths W1 and W2 and times T1 and T2 when the oxidizable regions of the at least two kinds of monitor-use semiconductor layers are totally oxidized. The relation between the oxidization time and rate can be obtained from the monitor-use semiconductor layers, so that the time necessary to define the aperture of the non-oxidized region can be calculated by extrapolation.

Preferably, the at least two kinds of monitor-use semiconductor layers have mesas that are formed by etching at the same time as the mesa of the laser portion is formed; and the mesas of the at least two kinds of monitor-use semiconductor layers have a layer structure identical to that of the mesa of the laser portion. Thus, the oxidization rates of the monitor-use semiconductor layers reflect the oxidization rate of the laser portion. Thus, monitoring the status of advancing oxidization of the monitor-use semiconductor layers is equivalent to that of the laser portion. It is therefore possible to accurately control the oxidization reaction on the III–V semiconductor layer containing Al.

Preferably, the at least two kinds of monitor-use semiconductor layers are arranged so as to form a strip pattern on the substrate. This arrangement averages dispersion of the shapes of the semiconductor layers and that of the oxidization distances, and realizes more reliable monitoring of oxidization condition.

For example, the mesa of the laser portion has a post shape, and the III–V semiconductor layer containing Al is one of an AlAs layer and an AlGaAs layer.

According to another aspect of the present invention, the method of fabricating a surface emitting semiconductor laser includes the steps of: forming a laminate of semiconductor layers including a III–V semiconductor layer containing Al on a substrate; forming, from the laminate, first, second and third mesas of different sizes on the substrate so that side surfaces of III–V semiconductor layers included in the first through third mesas are exposed; oxidizing the III–V semiconductor layers of the first through third mesas from the side surfaces thereof; optically monitoring oxidized conditions on the III–V semiconductor layers of the second and third mesas and obtaining, from times when the III–V semiconductor layers of the second and third mesas are terminated as well as the sizes thereof, an oxidization terminating time when oxidization of the III–V semiconductor layer of the first mesa should be terminated; and terminating oxidization of the III–V semiconductor layer of the first mesa to thus form a current confinement layer including an aperture that is a non-oxidized region of the III–V semiconductor layer of the first mesa.

Preferably, the first mesa has a post shape, and the non-oxidized region has a diameter of approximately 3 μm. Since the oxidization terminating time can be estimated accurately, the non-oxidized region, namely, the aperture that is as small as approximately 3 μm can be realized. It is therefore possible to realize single-mode oscillation.

According to yet another aspect of the present invention, the method of fabricating a surface emitting semiconductor laser includes the steps of: forming, on a substrate, multiple monitor-use semiconductor layers having stripes radiating from a center of the substrate, and a laser portion that includes semiconductor layers and is located on the periphery of the multiple monitor-use semiconductor layers; monitoring oxidized conditions on the multiple monitor-use semiconductor layers when a selectively oxidized region is formed in the laser portion; and controlling oxidization of the selectively oxidized region on the basis of the oxidized conditions thus monitored. The monitor-use semiconductor layers radiate from the center of the substrate. This facilitates to smooth movement of resist that is spin-coated and achieves a uniform-thickness resist film.

Preferably, the stripes radiating from the center are arranged with rotational symmetry about the center. The stripes radiating from the center may be divided into multiple groups at a given center angle, and each of the multiple groups has straight stripes. The stripes included in the adjacent groups among the multiple groups may form an angle of approximately 45°. For example, the stripes are equally divided into eight multiple groups at an angle of 45°. The divided groups may include straight stripes. The stripe pattern may be formed by a single kind of monitor-use semiconductor layers, or multiple pairs of stripe pattern, each being composed of two kinds of monitor-use semiconductor layers.

According to a further aspect of the present invention, the surface emitting semiconductor laser includes: a substrate; and a laminate of semiconductor layers on the substrate, the semiconductor layers including a first reflection mirror of a first conduction type, an active region on the first reflector mirror, a current confinement region including an oxidized region, and a second reflection mirror of a second conduction type, a mesa ranging at least from the second reflection mirror to the current confinement layer, the mesa extending at least from the second reflection mirror to the current confinement layer, the oxidized region of the current confinement layer utilizing an oxidization terminating time obtained by detecting times when oxidizable regions included in at least two kinds of monitor-use semiconductor layers having different shapes are totally oxidized.

The above laser has the oxidized region of the current confinement layer with high dimensional accuracy. It is therefore possible to efficiently confine current and light and to expect stable performance as designed.

According to a still further aspect of the present invention, the apparatus for fabricating a surface emitting semiconductor laser includes: a projection part projecting light onto an area including at least two kinds of monitor-use mesas respectively including III–V semiconductor layers that contain Al and have side surfaces exposed, when the side surfaces and a side surface of a III–V semiconductor layer of a laser-use mesa that contains Al and a side surface exposed are oxidized; a photoelectric conversion part converting reflected lights from the monitor-use mesas into electrical signals; an oxidization terminating time estimation part that detects times when the III–V semiconductor layers of the two kinds of monitor-use mesas are totally oxidized on the basis of the electrical signals, and estimates an oxidization terminating time when oxidization of the III–V semiconductor layer of the laser-use mesa should be terminated; and an oxidization control part causing oxidization of the III–V semiconductor layer of the laser-use mesa to be terminated at the oxidization terminating time to thus define a current confinement layer in the laser-use mesa.

It is therefore possible to control the oxidized region of the III–V semiconductor layer containing Al and realize highly reproducible oxidized region with high dimensional accuracy. This achieves improved production yield and cost reduction.

Although a few preferred embodiments of the present invention have been shown and described, it would be appreciated by those skilled in the art that changes may be made in these embodiments without departing from the principles and spirit of the invention, the scope of which is defined in the claims and their equivalents.

What is claimed is:

1. A surface emitting semiconductor laser comprising:
   a substrate; and
   a laminate of semiconductor layers on the substrate, the semiconductor layers including a first reflection mirror of a first conduction type, an active region on the first reflector mirror, a current confinement region including an oxidized region, and a second reflection mirror of a second conduction type, a mesa ranging at least from the second reflection mirror to the current confinement layer,
   the mesa extending at least from the second reflection mirror to the current confinement layer,
   the oxidized region of the current confinement layer utilizing an oxidization terminating time obtained by detecting times when oxidizable regions included in at least two kinds of monitor-use semiconductor layers having different shapes are totally oxidized.

2. The surface emitting semiconductor laser as claimed in claim 1, wherein the current confinement layer is an AlAs layer.

3. The surface emitting semiconductor laser as claimed in claim 1, wherein the current confinement layer is an AlGaAs layer.

* * * * *